United States Patent

Tominaga

[11] Patent Number: 5,844,293
[45] Date of Patent: *Dec. 1, 1998

[54] SEMICONDUCTOR DEVICE WITH IMPROVED DIELECTRIC BREAKDOWN STRENGTH

[75] Inventor: Tetsuya Tominaga, Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 648,793

[22] Filed: May 16, 1996

[30] Foreign Application Priority Data

May 19, 1995 [JP] Japan ................................ 7-121863

[51] Int. Cl.$^6$ ........................... H01L 23/58; H01L 29/00
[52] U.S. Cl. ...................... 257/489; 257/488; 257/494; 257/994
[58] Field of Search ................................ 257/488, 489, 257/494, 949, 992, 994

[56] References Cited

U.S. PATENT DOCUMENTS 3,852,801  12/1974  Itoh et al. .
4,430,663   2/1984  D'Altroy et al. .
4,713,681  12/1987  Beasom .

Primary Examiner—Ngân V. Ngô
Attorney, Agent, or Firm—McDermott, Will & Emery

[57] ABSTRACT

A semiconductor device is provided with improved resistance to dielectric breakdown due to high voltage resulting from static electricity applied to a dielectric film thereof, where a conductive film such as a resistance film or a electrode film is provided on a semiconductor substrate through the dielectric film in a manner electrically out of direct connection to the substrate. Embodiments include a conductor film pattern in electrical connection with the substrate, and at least one of the conductive film or the conductor film pattern is provided with a projecting portion to provide a narrow gap therebetween, thereby serving as a bypass to discharge static electricity.

8 Claims, 3 Drawing Sheets

SEMICONDUCTOR DEVICE WITH IMPROVED DIELECTRIC BREAKDOWN STRENGTH

BACKGROUND OF THE INVENTION

This invention relates to a semiconductor device having an improved dielectric breakdown characteristic, and more particularly to an improvement in breakdown strength of a dielectric film used in a semiconductor device having formed thereon a conductor film through the dielectric film.

Semiconductor devices in general include electronic elements such as transistors, diodes, resistors, capacitors, and so forth, interconnected to form electronic circuits in a semiconductor substrate. In addition, certain types of resistors, capacitors, or wiring conductor films are formed on a surface of the substrate through an insulation film.

A transistor of the built-in resistance type, for instance, has a structure as illustrated in a cross-sectional view of FIG. 4. That is, a semiconductor substrate 1 has an $n^+$-type semiconductor layer 1a and an n-type epitaxial layer 1b formed thereon to constitute a collector region. A base region 2 is provided by forming a p-type region in the epitaxial layer 1b, and an emitter region 3 is further formed by providing an $n^+$-type region in the base region 2. The semiconductor substrate 1 has a dielectric film 4 of silicon oxide formed over a surface thereof, on which a resistive film 5 of polysilicon is further formed. The dielectric film 4 has contact holes 4a, 4b opened therein so that a patterned metallic electrode layer comprising aluminum, etc. deposited through the holes 4a, 4b provides a base electrode 6 and an emitter electrode 7, as shown in a plan view of FIG. 5. The resistive film 5 has one end thereof connected to the base electrode 6 and the other end thereof having an electrode pad 8 formed thereon. The electrode pad 8 is formed simultaneously with the metallic electrode layer described above. Further, a second resistive film 15 is connected between the base electrode 6 and the emitter electrode 7. Incidentally, a collector electrode, not shown, is provided on a back surface of the semiconductor substrate 1. Also, 9 is an $n^+$-type channel-stop diffusion region formed in a peripheral surface of the semiconductor substrate 1 for prevention of electric current leakage.

In the semiconductor device, the respective ends of the second resistive film 15 has direct connections to the base electrode 6 and the emitter electrode 7 which are in electrical connection to the semiconductor layer 1b. Consequently, the second resistive film 15 is free from electrification with static electricity and hence the resultant application thereto of a high voltage created across the semiconductor substrate 1, even when static electricity, etc. is introduced thereinto through external leads. However, where the resistive film 5 has the electrode pad 8 at the other end which has no connections to the semiconductor layer 1b but is left provided on the dielectric film 4 over the semiconductor substrate 1, static electricity introduced into the electrode pad 8 through the external leads builds up on the electrode pad 8 together with the resistive film 5.

As stated above, if there is present a conductive film, such as an electrode pad and a resistive film electrically connected thereto, on a semiconductor substrate through a dielectric film, then such conductive film is electrified with static electricity introduced through the external leads, with the result that a high voltage is applied to the dielectric film between the semiconductor substrate and the conductive film. As a result, the dielectric film will be broken down by such high voltage to cause the device to fail.

On the other hand, if the dielectric film is formed sufficiently thick, it becomes resistant to dielectric breakdown. However, when the dielectric film is formed by a thermal oxidation method, it takes approximately 9 hours to form it to a thickness of 0.95 micrometer, thus requiring a long time and hence extending the time for the fabrication process. Although the formation by a CVD technique to a thickness of 0.6 micrometer takes only about 15 minutes, a high-density film cannot be formed by such method. To this end, there is a problem in that there is a conflict between the necessity for high-density film to be formed by the thermal oxidation method but the method takes an excessively long time.

SUMMARY OF THE INVENTION

It is therefore the object of the invention to provide a semiconductor device, which has a conductive film formed on a substrate thereof through a dielectric film so that the dielectric film has an improved resistance to breakdown even when the conductive film is applied with high voltage due to static electricity, etc.

A semiconductor device according to the invention has a semiconductor substrate including electronic elements formed therein and a dielectric film formed over a surface thereof, the semiconductor device comprising:

a conductive film formed on the semiconductor substrate through the dielectric film so as to not be in direct electrical connection with the semiconductor substrate;

a conductor film pattern formed in direct electrical connection with the semiconductor substrate; and a projecting portion provided in at least one of the conductive film and the conductor film pattern to provide a gap between the conductive film and the conductor film pattern.

The conductive film as hereinemployed refer to a film having electrical conductivity, which includes electrode pads and wiring patterns of aluminum or titanium, interconnecting wiring of polysilicon, resistive films containing an electrically-resistive component, etc.

According to the invention, a projecting portion is provided to form a narrow gap between a conductive film not directly electrically connected with a semiconductor substrate and a conductor film pattern in electrical connection with the semiconductor substrate, wherein the conductive film is formed as an electrode pad, a resistive film, etc. on the semiconductor substrate through a dielectric film. Consequently, even if static electricity is introduced through external leads to the conductive film, i.e., the electrode pad or the resistive film, to cause electrification of same, the breakdown voltage across the gap provided by the projecting portion is lower than the break down voltage across the dielectric film with respect to the semiconductor substrate. As a result, electric discharge, if it occurs, takes place at the gap provided by the projecting portion, thereby releasing the static electricity built up on the conductive film. Thus, electrical discharge will not occur through the dielectric film from the conductive film to the semiconductor substrate.

In the case of electric discharge occurring through the projecting portion, the semiconductor device does not experience breakdown in the insulation structure of the projecting portion, thereby being free from failure thereof. In usual operation of the device, the voltage applied between the conductive film and the semiconductor substrate is small, i.e. approximately several volts or less than $\frac{1}{100}$ of the voltage due to static electricity. Therefore, the provision of the narrow gap does not have a practical effect upon the usual dielectric characteristics.

As an embodied example, where the semiconductor device is a transistor of the built-in resistance type and the conductive film is a polysilicon resistive film constituting the built-in resistance, the dielectric film is well prevented from breaking down due to static electricity, which electricity is apt to build up on the resistance film. Further, static electricity carried on the conductive film or other components is effectively released by electrically discharging through the gap provided by the projecting portion, by providing a channel-stop diffusion region around the transistor and electrically connecting the conductor film pattern with the channel-stop region.

DETAILED DESCRIPTION

Figure 1:
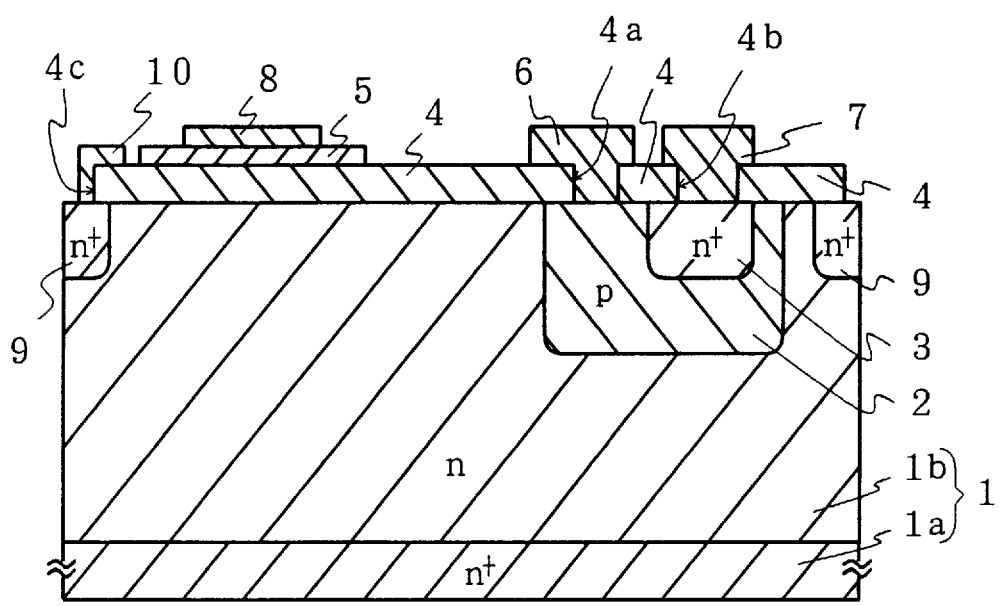
FIG. 1 is a schematic cross-sectional view of a transistor of the built-in resistance type as a semiconductor device according to one embodiment of the invention.

A semiconductor device according to the invention will now be explained by referring to the drawings.

There is illustrated in FIG. 1 a schematic cross-sectional view of a semiconductor device comprising a transistor of the built-in resistance type as one embodiment according to the invention.

In the figure, a semiconductor device is constituted by a semiconductor substrate 1 having a collector region formed by a semiconductor layer 1a and an n-type epitaxial layer 1b. A base region 2 is formed by a p-type diffusion layer in the epitaxial layer 1b, and further an emitter region 3 is formed by an n$^+$-type diffusion layer in the base region 2.

Figure 2:
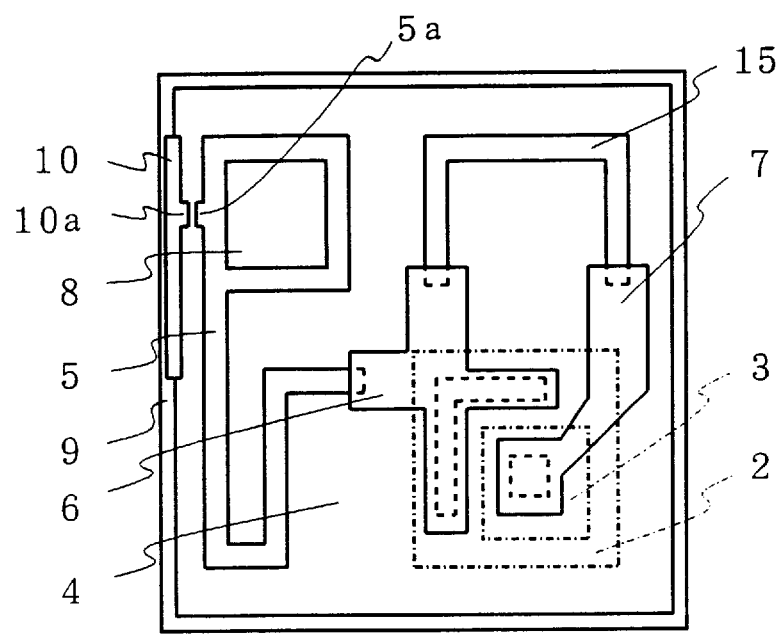
FIG. 2 is a schematic plan view of the transistor of FIG. 1.

A dielectric film 4 of silicon oxide is further formed over the surface of the substrate 1 so that a resistive film 5 of polysilicon is provided on the substrate 1 through the dielectric film 4. The resistive film 5 has one end thereof connected to a base electrode 6 and the other end thereof having an electrode pad 8 formed thereon, as shown in FIG. 2. The base electrode 6 and the emitter electrode 7 are connected to the base region 2 and the emitter region 3, respectively, via contact holes 4a and 4b formed through the dielectric film 4. These base and emitter electrodes 6, 7 are formed of an aluminum layer which is patterned simultaneously with the electrode pad 8.

Figure 3:
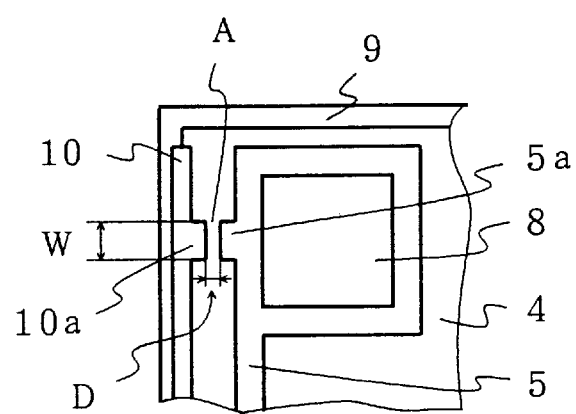
FIG. 3 is a partially enlarged view showing an essential part in FIG. 2.
Figure 4:
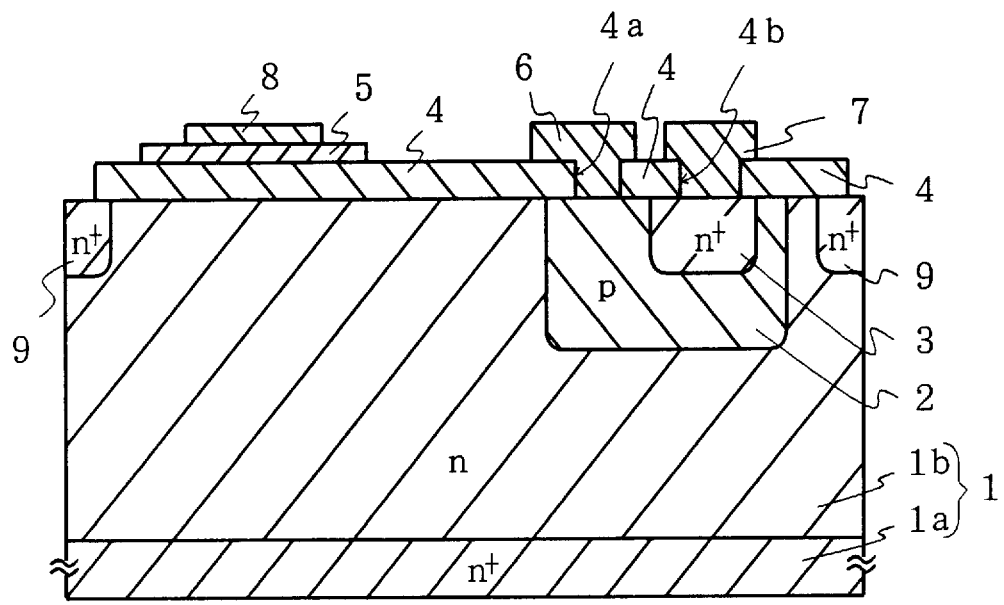
FIG. 4 is a schematic cross-sectional view of the conventional transistor of the resistance-built-in type.
Figure 5:
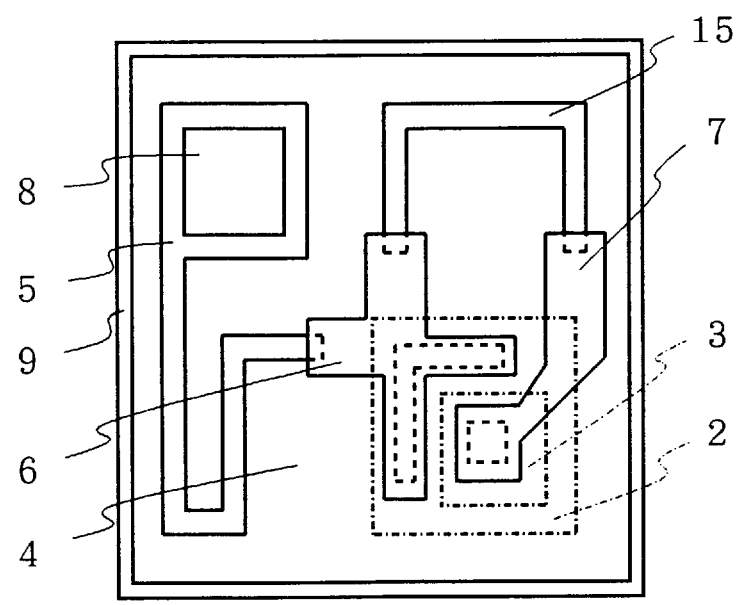
FIG. 5 is a schematic plan view of FIG. 4.

In this embodiment, the substrate 1 has an n$^+$-type diffusion region 9 which is formed as a channel-stop region in a peripheral surface thereof. A conductor film pattern 10 formed of aluminum is connected with the channel-stop region 9 through a contact wall 4c. The conductor film pattern 10 and the resistive film 5, being electrically conductive, have respective projecting portions 10a and 5a which provide a narrow gap A therebetween, as shown in FIG. 3. The surface of the substrate 1 thus formed is coated with a protection layer of silicon nitride or silicon oxide, not shown, except for the surface of the electrode pad 8.

The gap A between the projecting portions 5a and 10a serves to cause electric discharge therebetween to release static electricity when such electricity is carried on the electrode pad 8. Consequently, if the gap A is provided with a narrow width W over a small range instead of over a wide range, then the electric field is appropriately concentrated to facilitate electric discharge therethrough. It is preferred to select the width W in FIG. 3 to be in a range of from 0.5 to 1 micrometer.

Although the gap A is filled with the above-stated protection layer covering the surfaces of the resistive film 5 and conductor film pattern 10, electric discharge is facilitated to occur through an interface of the protection layer and the substrate 1 between the projecting portions 5a and 10a. Also, the provision of the narrowed width W between the projecting portions 10a and 5a also contributes to occurrence of electric discharge. Such electric discharge effectively suppresses the occurrence of electric discharge through the dielectric film 4. By making the spacing D between the oppositely projecting portions 10a and 5a smaller than the thickness of the dielectric film 4, the electric field is further concentrated so as to contribute to the prevention of breakdown in the dielectric film 4.

In this embodiment, the projecting portions 10a, 5a are oppositely formed in both the conductor film pattern 10 and the resistance film 5 for providing the gap A. However, the formation of such projections in either one of the conductors so as to closely approach the other conductor may be satisfactory.

In this embodiment, the projecting portions 10a, 5a are formed by using aluminum and polysilicon respectively for the conductor film pattern 10 and the resistive film 5, in order to evenly control the heights of both projecting portions 10a and 5a during the film-forming processes, as shown in FIG. 1. Instead, other combinations of conductor materials, e.g., a common metallic material or a common polysilicon material, may be applied in a similar manner for forming the combination of the conductor film pattern and the conductive film such as the electrode pad, the resistive film, the interconnection wiring, etc., for formation of the projecting portions, provided that such materials be usable as a conductor. By using such a material, a bypass for electric discharge is also obtainable for the protection of a dielectric film.

According to the invention, even where there is present a conductive film, which is not directly connected to the semiconductor substrate due to a dielectric film interposed therebetween, such as an electrode pad, a resistive film, a wiring film, a narrow gap can easily be provided by forming a projecting portion in at least one of the conductive film and a conductor film pattern connected to the semiconductor substrate. Accordingly, even when static electricity is built up on the conductive film, the gap serves as a bypass to discharge such static electricity, thereby effectively well suppressing the occurrence of electrical discharge through the dielectric film interposed between the semiconductor substrate and the conductive film. As a result, the dielectric breakdown strength is increased without the necessity of increasing the thickness of the dielectric film, thereby providing enhanced reliability for the device through a simplified fabrication process.

It is preferred for the protection of the dielectric film to provide a gap such that the spacing D provided by the projecting portion is smaller than the thickness of the dielectric film, so as to cause electrical discharge therethrough to occur before the occurrence of breakdown in the dielectric film.

It is preferred for the suppression of electric discharge through the dielectric film to select the width W of the projecting portion to be within a range of 0.5 to 1 micrometer, so as to appropriately concentrate the electric field to a narrow region and hence facilitate the occurrence of electric discharge.

It is preferred to provide projecting portions in both the conductive film and the conductor film pattern, so as to narrow the spacing D between the opposite portions of the gap.

The effect of the invention is pronounced, if the conductive film is a resistive film formed of polysilicon which is readily electrified by static electricity.

The dielectric film possesses increased breakdown strength with a high-density structure, if the semiconductor substrate is formed of silicon and the dielectric film is formed through thermal oxidation of the silicon thereof.

Though several embodiments of the invention are described above, it is to be understood that the present invention is not limited to the above-mentioned embodiments, and various changes and modifications may be made in the invention without departing from the spirit and scope thereof.

What is claimed is:

1. A semiconductor device comprising:
    a semiconductor substrate including electronic elements formed therein;
    a dielectric film formed over a surface of said substrate;
    a conductive film, having a length substantially greater than the width thereof, formed on said dielectric film and out of direct electrical connection with said semiconductor substrate;
    a conductor film pattern, having a length substantially greater than the width thereof, formed in direct electrical connection with said semiconductor substrate; and
    a projecting portion provided in a small portion of the length of at least one of said conductive film and said conductor film pattern to provide a narrow gap extending for a short distance between said conductive film and said conductor film pattern.

2. A semiconductor device as claimed in claim 1, wherein said projecting portion is provided so that the width of said gap is not greater than the thickness of said dielectric film.

3. A semiconductor device as claimed in claim 1, wherein the length of said projecting portion is from 0.5 to 1 micrometer.

4. A semiconductor device as claimed in claim 1, wherein said projecting portion is provided in both said conductive film and said conductor film pattern.

5. A semiconductor device sa claimed in claim 1, wherein said conductive film is a resistive film formed of polysilicon.

6. A semiconductor device as claimed in claim 1, wherein said semiconductor substrate is formed of silicon, and said dielectric film is formed by thermal oxidation of said silicon of said semiconductor substrate.

7. A semiconductor device having a semiconductor substrate including electronic elements formed therein and a dielectric film formed over a surface thereof, said semiconductor device comprising:
    a conductive film formed on said semiconductor substrate through said dielectric film in a manner out of direct connection with said semiconductor substrate;
    a conductor film patter formed in direct connection with said semiconductor substrate; and
    a projecting portion provided in at least one of said conductive film and said conductor film pattern to provide a gap between said conductive film and said conductor film pattern,
    wherein said semiconductor device comprises a transistor of the built-in-resistance type, and said conductive film is formed by a resistive film of polysilicon comprising said built-in-resistance.

8. A semiconductor device as claimed in claim 7, wherein a channel-stop diffusion region is formed surrounding said transistor formed in said semiconductor device, and said conductor film pattern is electrically connected to said channel-stop diffusion region.

\* \* \* \* \*